US011671085B2

(12) United States Patent
Olieman et al.

(10) Patent No.: US 11,671,085 B2
(45) Date of Patent: Jun. 6, 2023

(54) CIRCUIT TO CORRECT DUTY CYCLE AND PHASE ERROR OF A DIFFERENTIAL SIGNAL WITH LOW ADDED NOISE

(71) Applicant: NXP B. V., Eindhoven (NL)

(72) Inventors: Erik Olieman, Waalre (NL); Mark Stoopman, Capelle aan den ijssel (NL); Helmut Kranabenter, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/515,868

(22) Filed: Nov. 1, 2021

(65) Prior Publication Data

US 2023/0133268 A1 May 4, 2023

(51) Int. Cl.
*H03K 5/156* (2006.01)
*H04B 1/40* (2015.01)

(52) U.S. Cl.
CPC ............. *H03K 5/1565* (2013.01); *H04B 1/40* (2013.01)

(58) Field of Classification Search
CPC ...... H03K 5/1565; H03K 5/133; H03K 3/017; H03K 5/135; H03K 2005/00052; H03K 7/08; H03K 2005/00208; H03K 7/00; H03K 5/156; H03K 5/13; H03K 2005/00195; H03K 2005/0015; H03K 2005/00026; H03K 2005/00019; H03K 2005/00013; H03K 5/00; H03K 3/01; H03K 3/00; H03K 5/151; H03K 19/0016; H03K 5/04; H03K 5/086; H03K 5/15; H03K 19/018528; H03K 19/0008; H03K 19/00
See application file for complete search history.

(56) References Cited

U.S. PATENT DOCUMENTS 8,513,997 B2   8/2013  Hesen et al.
9,219,470 B1*  12/2015 Venditti ............... H03K 5/1565
(Continued)

FOREIGN PATENT DOCUMENTS

EP     1898582 A1   3/2008

OTHER PUBLICATIONS

Raghavan et al., "Architectural Comparison of Analog and Digital Duty Cycle Corrector for High Speed I/O Link," IEEE (2010) pp. 270-275, 23rd International Conference on VLSI Design.
(Continued)

*Primary Examiner* — Diana J. Cheng (57) ABSTRACT

A duty cycle correction (DCC) circuit for use in relation to differential signal communications, a method of providing duty cycle correction, and communications systems and methods employing same, are disclosed herein. In one example embodiment, the circuit includes a differential signal inverter circuit including first and second inverter circuits, each of which has a respective inverter and respective first and second transistor devices respectively coupled between the respective inverter and first and second voltages, respectively. The circuit also includes a feedback circuit coupled to respective output ports of the respective first and second inverter circuits and also to respective feedback input ports of the respective transistor devices. The feedback circuit operates to provide one or more feedback signals causing one or more of the transistor devices to perform current limiting. Respective duty cycles of output signals respectively are equal or substantially equal based on the current limiting.

19 Claims, 6 Drawing Sheets

(56) References Cited

U.S. PATENT DOCUMENTS

| | | |
|---|---|---|
| 10,547,298 B1 | 1/2020 | Mekky et al. |
| 10,615,785 B1 | 4/2020 | Chou et al. |
| 2008/0191772 A1 | 8/2008 | Pickering et al. |
| 2014/0125391 A1 | 5/2014 | Seon |
| 2014/0266361 A1 | 9/2014 | Shashidharan et al. |
| 2018/0302075 A1 | 10/2018 | Schultz et al. |

OTHER PUBLICATIONS

Huang et al., "Low-Power 50% Duty Cycle Corrector," IEEE (2008) pp. 2362-2365.

\* cited by examiner

CIRCUIT TO CORRECT DUTY CYCLE AND PHASE ERROR OF A DIFFERENTIAL SIGNAL WITH LOW ADDED NOISE

FIELD OF THE DISCLOSURE

The present disclosure relates to wireless transmitters, receivers, or transceivers, such as radio frequency (RF) transmitters, receivers, and transceivers, and more particularly relates to circuits for performing duty cycle correction and/or reducing phase error in relation to differential signals communicated by such transmitters, receivers, or transceivers.

BACKGROUND OF THE DISCLOSURE

In the context of RF communications involving RF circuits, it is often necessary to communicate differential signals such as a local oscillator (LO) signal over large distances. To achieve the delivery of such differential signals over large distances typically require buffers. However, the use of buffers in conventional systems often can diminish performance and signal quality in various manners.

For at least one or more of these reasons, or one or more other reasons, it would be advantageous if new or improved circuits or systems could be developed, and/or improved methods of operation or implementation could be developed, so as to address any one or more of the concerns discussed above or to address one or more other concerns or provide one or more benefits.

DETAILED DESCRIPTION

The present disclosure envisions, in at least one or more example embodiments encompassed herein, the implementation of an electrical circuit that is a duty cycle correction (DCC) circuit having an analog feedback (control) loop. The analog control loop provides feedback to current-limiting transistors of an inverter section based upon differential output signals. More particularly, the analog control loop utilizes, as its inputs, the low pass filtered output signals, which contain their duty cycle component. The analog control loop operates to achieve duty cycle correction by adding a delay that is appropriate to fix duty cycle errors by controlling the current-limiting transistors in a manner that current starves either the positive or the negative half of an inverter (that is, by controlling the current-limiting transistors in a manner that sets a limit on the current each inverter can draw). For example, the analog control loop of the DCC circuit can operate to achieve duty cycle correction by adding only the delay (or substantially only the delay, or a bare minimum of delay) that is appropriate to fix any timing error(s) present in the input signal (but not more or not substantially more). Further for example, if the positive signal input (of the differential signal input) is delayed by 10 picoseconds (ps), the DCC circuit can operate to delay the negative signal input (of the differential signal input) also by 10 ps. Additionally for example, when there is no timing error, all of the controlled delay blocks can be set to the maximum speed possible in the technology.

Further, in at least some example embodiments encompassed herein, the fully differential structure of the DCC circuit operates to make the duty cycles of the positive and the negative output signals equal in a manner that (e.g., in addition to adding only a bare minimum or minimal delay) keeps phase noise low. Such a DCC circuit thus is useful in both receivers and transmitters (and transceivers) to improve second order distortion (HD2) performance, and can be especially valuable when there are multiple buffer stages between clock generation and the transmitter/receiver.

Additionally the present disclosure also envisions, in at least one or more example embodiments encompassed herein, the addition of cross-coupled inverters to such a DCC circuit. The cross-coupled inverters operate to force the crossing point of the positive and negative output signals to half of the difference between the high and low levels of those signals. For example if the high levels attained by those signals is a supply voltage (e.g., Vdd) and the low levels attained by those signals is ground, then the cross-coupled inverters operate to force those differential signals to cross one another when both signals have a voltage that is half of the difference between the supply voltage and ground (e.g., Vdd/2). Since the duty cycles of the positive and negative signals are already equal (due to operation of the DCC circuit), and their crossing point occurs at a voltage midway between the high and low levels of those signals (e.g, at Vdd/2), the circuit not only causes the duty cycles of both signals to be equal, but also causes the signals to have a phase difference of 180 degrees and to have duty cycles at 50%. Thus, such a DCC circuit with cross coupled inverters serves to suppress any form of HD2 in differential signals (e.g., such as a LO signal) in a manner that avoids adding significant phase noise.

Figure 1:
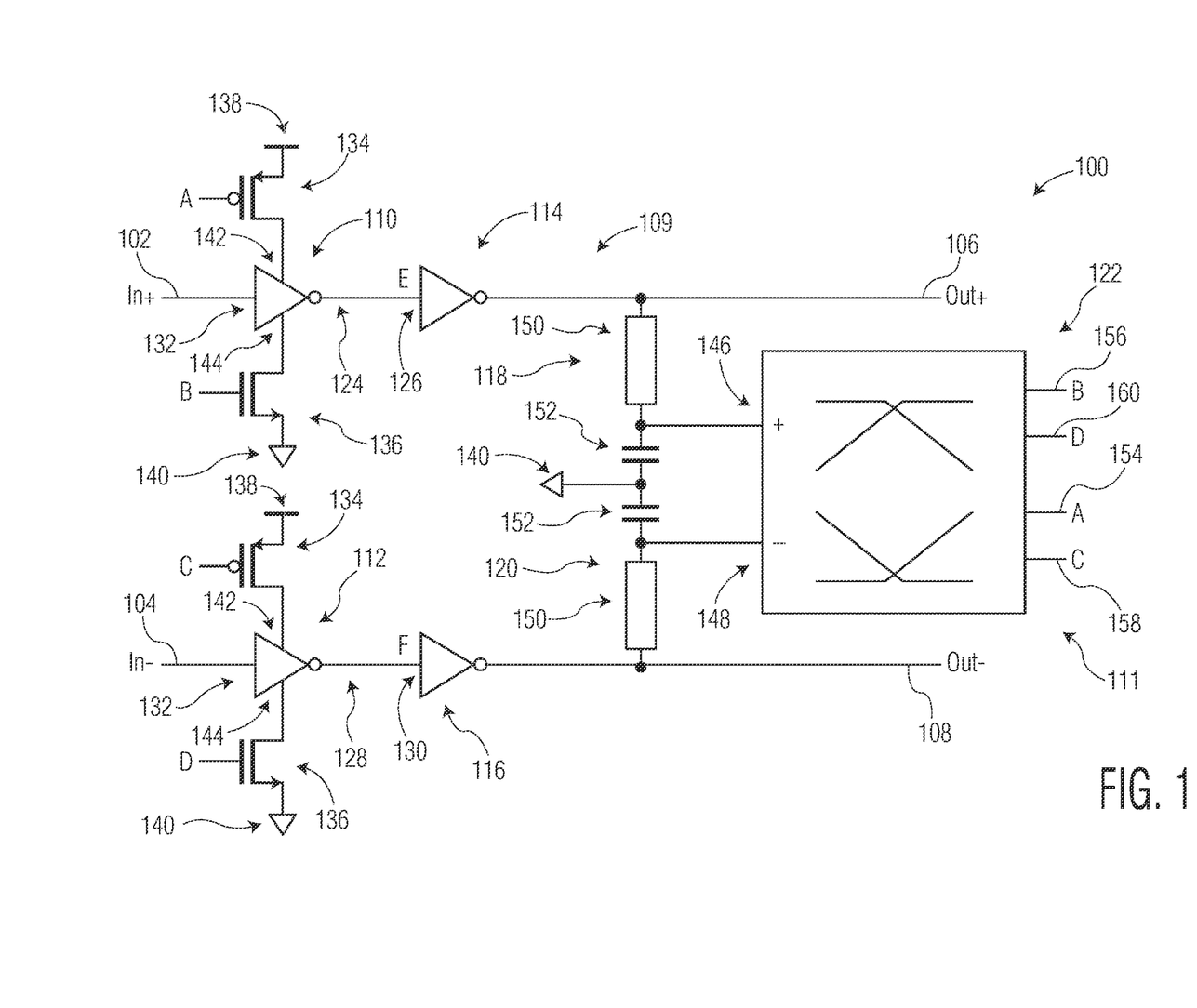
FIG. 1 is a schematic diagram showing a first duty cycle correction (DCC) circuit in accordance with a first example embodiment encompassed herein.

Referring to FIG. 1, a schematic diagram is provided that shows a first duty cycle correction (DCC) circuit 100 in accordance with a first example embodiment encompassed herein. As shown, the first DCC circuit 100 is a differential signal type DCC circuit that includes a first input port 102 and a second input port 104, as well as a first output port 106 and a second output port 108. For purposes of the present example, the first input port 102 can be considered a positive input signal port (In+) at which a positive input signal can be received, the second input port 104 can be considered a negative input signal port (In−) at which a negative input signal can be received, the first output port 106 can be considered a positive output signal port (Out+) at which a positive output signal can be output by the first DCC circuit 100, and the second output port 108 can be considered a negative output signal port (Out−) at which a negative output signal can be output by the first DCC circuit.

Further as shown, the first DCC circuit 100 includes a differential signal inverter circuit 109 and a feedback circuit 111. The differential signal inverter circuit 109 includes each of a first inverter circuit 110, a second inverter circuit 112, a first buffer 114 and a second buffer 116, and the feedback circuit 111 includes a first low pass filter circuit 118, a second low pass filter circuit 120, and an operational amplifier circuit 122. The first input port 102 also constitutes a first inverter input port of the first inverter circuit 110 of the differential signal inverter circuit 109, and the second input port 104 also constitutes a second inverter input port of the second inverter circuit 112 of the differential signal inverter circuit 109. Additionally as shown, a first inverter output port 124 of the first inverter circuit 110 is coupled to a first buffer input port 126 of the first buffer 114, and a second inverter output port 128 of the second inverter circuit 112 is coupled to a second buffer input port 130 of the second buffer 116. In the present embodiment, the first inverter output port 124 is directly coupled to (and constitutes the same electrical node as) the first buffer input port 126, and the second inverter output port 128 is directly coupled to (and constitutes the same electrical node as) the second buffer input port 130. Further, the first output port 106 particularly is provided as a first buffer output port of the first buffer 114, and the second output port 108 particularly is provided as a second buffer output port of the second buffer 116.

More particularly, each of the first inverter circuit 110 and the second inverter circuit 112 includes a respective inverter or buffer 132, a respective PMOS transistor (P-type metal-oxide-semiconductor field-effect transistor) 134, and a respective NMOS transistor (N-type metal-oxide-semiconductor field-effect transistor) 136. In each of the first and second inverter circuits 110, 112, the respective buffer 132 is coupled to a supply voltage 138 by way of the respective PMOS transistor 134, and is coupled to a ground voltage (coupled to a grounded location or to ground) 140 by way of the respective NMOS transistor 136. More particularly, with respect to each of the respective first and second inverter circuits 110, 112, a respective drain of the respective PMOS transistor 134 is coupled directly to a respective supply terminal 142 of the respective buffer 132 of the respective inverter circuit, and a respective source of the respective PMOS transistor is coupled to the supply voltage 138. Also, with respect to each of the respective first and second inverter circuits 110, 112, a respective drain of the respective NMOS transistor 136 is coupled to a respective ground terminal 144 of the respective buffer 132 of the respective inverter circuit, and a respective source of the respective NMOS transistor is coupled to the ground voltage 140. As described further below, each of the PMOS and NMOS transistors 134, 136 can serve a current limiting role depending upon operational circumstances.

With respect to the feedback circuit 111, the first low pass filter circuit 118 is coupled between the first output port 106 (that is, the first buffer output port) and a first amplifier input port 146 of the operational amplifier circuit 122, and the second low pass filter circuit 120 is coupled between the second output port 108 (and correspondingly the second buffer output port) and a second amplifier input port 148 of the operational amplifier circuit. More particularly, each of the first low pass filter circuit 118 and the second low pass filter circuit 120 includes a respective resistor 150 and a respective capacitor 152. The respective resistor 150 of the first low pass filter circuit 118 is coupled between the first output port 106 (that is, the first buffer output port of the first buffer 114) and the first amplifier input port 146 of the operational amplifier circuit 122, which can also be considered to be the first output port of the first low pass filter circuit. Also, the respective resistor 150 of the second low pass filter circuit 120 is coupled between the second output port 108 (that is, the second buffer output port of the second buffer 116) and the second amplifier input port 148 of the operational amplifier circuit 122, which can also be considered to be the second output port of the second low pass filter circuit. Further, the respective capacitor 152 of the first low pass filter circuit 118 is coupled between the first amplifier input port 146 of the operational amplifier circuit 122 and the ground voltage 140, and thus is also coupled between the respective resistor 150 of the first low pass filter circuit and the ground voltage. Further, the respective capacitor 152 of the second low pass filter circuit 120 is coupled between the second amplifier input port 148 of the operational amplifier circuit 122 and the ground voltage 140, and thus is also coupled between the respective resistor 150 of the second low pass filter circuit and the ground voltage.

In addition to including the first amplifier input port 146 and the second amplifier input port 148, the operational amplifier circuit 122 also includes first, second, third, and fourth output ports 154, 156, 158, and 160, which are also labeled in FIG. 1 as A, B, C, and D, respectively. Although not shown by way of wire linkages in FIG. 1, the first, second, third, and fourth output ports 154, 156, 158, and 160 are respectively coupled to different respective gates of the respective PMOS transistors 134 and NMOS transistors 136 of the first inverter circuit 110 and the second inverter circuit 112, which are also labeled as A, B, C, and D in FIG. 1. More particularly as indicated by the A labels, the respective gate of the PMOS transistor 134 of the first inverter circuit 110 is directly coupled to (and constitutes electrically the same node as) the first output port 154 of the operational amplifier circuit 122. Also, as indicated by the B labels, the respective gate of the NMOS transistor 136 of the first inverter circuit 110 is directly coupled to (and constitutes electrically the same node as) the second output port 156 of the operational amplifier circuit 122. Further, as indicated by the C labels, the respective gate of the PMOS transistor 134 of the second inverter circuit 112 is directly coupled to (and constitutes electrically the same node as) the third output port 158 of the operational amplifier circuit 122. Additionally, as indicated by the D labels, the respective gate of the NMOS transistor 136 of the second inverter circuit 112 is directly coupled to (and constitutes electrically the same node as) the fourth output port 160 of the operational amplifier circuit 122.

Figure 2:
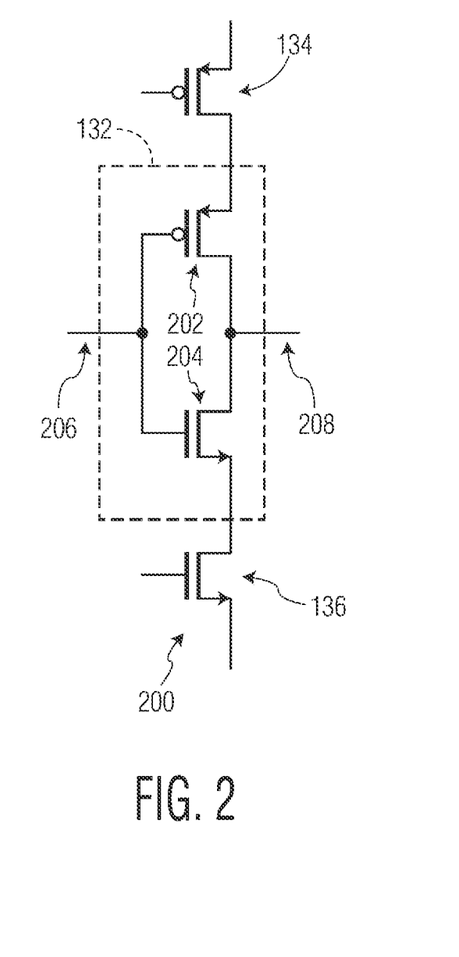
FIG. 2 is a schematic diagram showing example components of an inverter as is employed by the first DCC circuit of FIG. 1.

Referring additionally to FIG. 2, an additional schematic diagram 200 is provided to show in more detail the components included in each of the first inverter circuit 110 and the second inverter circuit 112. More particularly as shown, each of the first inverter circuit 110 and the second inverter circuit 112 includes the respective buffer 132, respective PMOS transistor 134, and respective NMOS transistor 136. Additionally as shown, the respective buffer 132 includes a respective additional PMOS transistor 202 and a respective additional NMOS transistor 204. The respective drain of the PMOS transistor 134 is directly coupled to the source of the respective additional PMOS transistor 202, and the respective drain of the NMOS transistor 136 is directly coupled to the source of the respective additional NMOS transistor 204. Further, the respective gates of the respective additional PMOS and NMOS transistors 202 and 204 are directly coupled together to form an input node 206, and the respective drains of the respective additional PMOS and NMOS transistors are directly coupled together to form an output node 208. It should be appreciated that, if the inverter circuit represented by the additional schematic diagram 200 is implemented as the first inverter circuit 110 of FIG. 1, then the input node 206 can serve as the first input port 102 and the output node 208 can serve as the first inverter output port 124. Also, if the inverter circuit represented by the additional schematic diagram 200 is implemented as the second inverter circuit 112 of FIG. 1, then the input node 206 can serve as the second input port 104 and the output node 208 can serve as the second inverter output port 128.

It should be appreciated that, in addition to providing the additional schematic diagram 200 that is representative of each of the first and second inverter circuits 110, 112, FIG. 2 also illustrates in more detail the components of each of the first and second buffers 114, 116. In particular, it should be appreciated that the buffer 132 shown in FIG. 2 not only is representative of the components of each of the respective buffers 132 of the first and second inverter circuits 110, 112 of FIG. 1, but also is representative of the components of each of the first and second buffers 114, 116. That is, each of the first and second buffers 114, 116 should be understood to include both the additional PMOS transistor 202 and the additional NMOS transistor 204, coupled with one another as illustrated by the buffer 132 of FIG. 2. Again, as shown in FIG. 2, the input node 206 formed by the coupled-together gates of the additional PMOS and NMOS transistors 202, 204 can be understood to constitute each of the respective first and second buffer input ports 126, 130 of the first and second buffers 114, 116, respectively. Also, the output node 208 formed by the coupled-together drains of the additional PMOS and NMOS transistors 202, 204 can be understood to constitute each of the respective first and second buffer output ports of the first and second buffers 114, 116 of FIG. 1 (which again respectively are the first and second output ports 106, 108).

Figure 3:
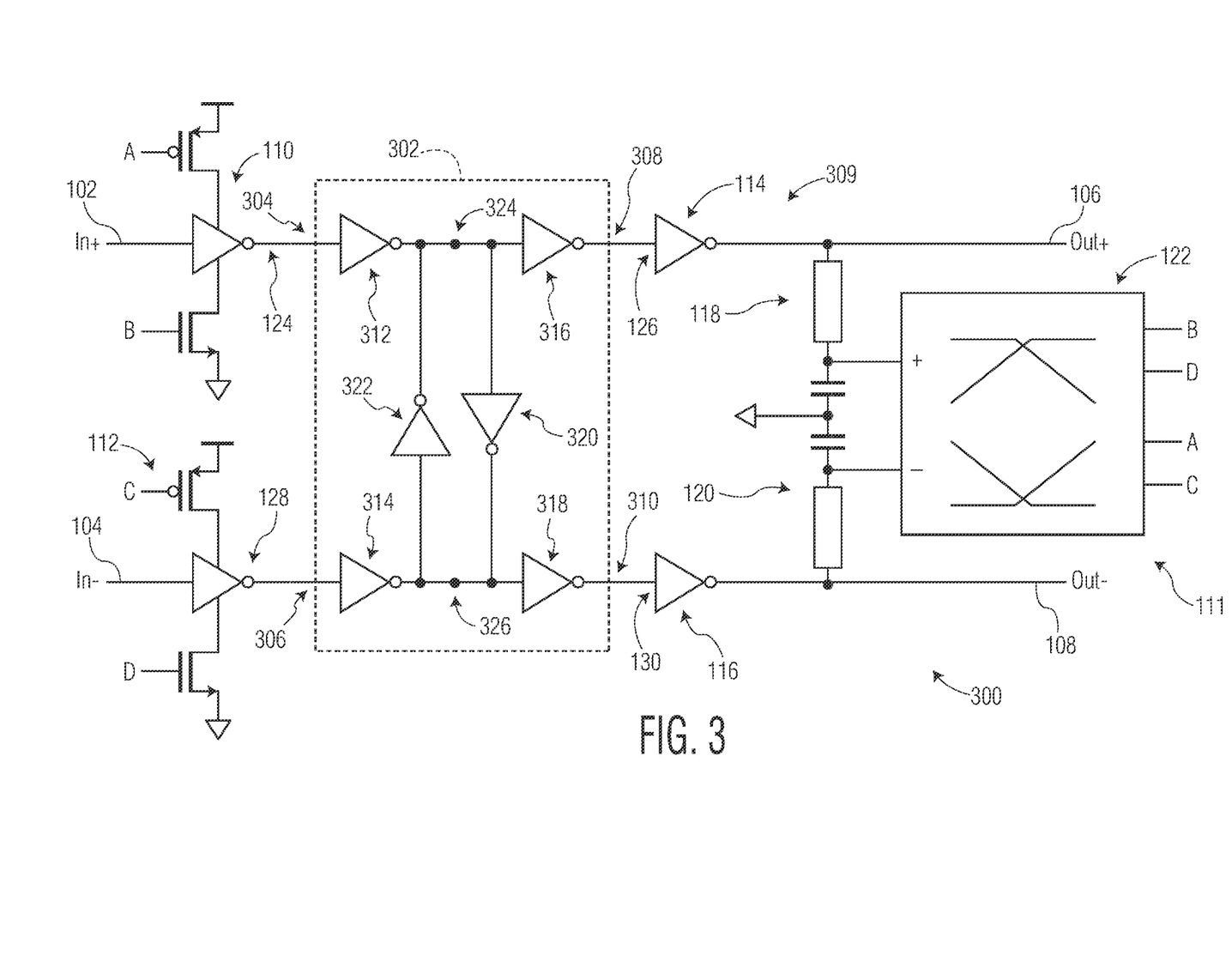
FIG. 3 is a schematic diagram showing a second DCC circuit including a cross-coupled inverter section in accordance with a second example embodiment encompassed herein.

Turning to FIG. 3, an additional schematic diagram is provided that shows a second duty cycle correction (DCC) circuit 300 in accordance with a second example embodiment encompassed herein. The second DCC circuit 300 of FIG. 3 is identical to the first DCC circuit 100 of FIG. 1 except insofar as the second DCC circuit includes a differential signal inverter circuit 309 that additionally includes, in contrast to the differential signal inverter circuit 109 of FIG. 1, a cross-coupled inverter section 302. As shown, the cross-coupled inverter section 302 is coupled between the first and second inverter circuits 110, 112 and the first and second buffers 114, 116. More particularly, in this example embodiment, the first inverter output port 124 is no longer directly coupled to the first buffer input port 126 of the first buffer 114, and the second inverter output port 128 is no longer directly coupled to the second buffer input port 130 of the second buffer 116. Rather, the cross-coupled inverter section 302 is coupled between the first inverter output port 124 and the first buffer input port 126, and also is coupled between the second inverter output port 128 and the second buffer input port 130. In this regard, the cross-coupled inverter section 302 can be understood to include first and second input ports 304 and 306, respectively, which are respectively directly coupled to the first and second inverter output ports 124 and 128, respectively, and also first and second output ports 308 and 310, respectively, which are respectively directly coupled to the first and second buffer input ports 126 and 130, respectively.

Further as shown, the cross-coupled inverter section 302 includes third, fourth, fifth, sixth, seventh, and eighth buffers (or inverters) 312, 314, 316, 318, 320, and 322, respectively.

Each of the buffers 312, 314, 316, 318, 320, and 322 can take the same form as the buffer 132 described in regard to FIG. 2 (and thus can take the same form as each of the first and second buffers 114, 116 or each of the inverters 132), and particularly includes a respective input port corresponding to the input node 206 and a respective output port corresponding to the output node 208. The first input port 304 of the cross-coupled inverter section 302 constitutes the input port of the third buffer 312, and the second input port 306 of the cross-coupled inverter section constitutes the input port of the fourth buffer 314. The first output port 308 of the cross-coupled inverter section 302 is the output port of the fifth buffer 316, and the second output port 310 of the cross-coupled inverter section is the output port of the sixth buffer 318. Additionally, the output port of the third buffer 312 is coupled directly to the input port of the fifth buffer 316, and the directly coupled ports constitute a first intermediate node 324. Also, the output port of the fourth buffer 314 is coupled directly to the input port of the sixth buffer 318, and the directly coupled ports constitute a second intermediate node 326.

Finally, each of the seventh buffer 320 and eighth buffer 322 is coupled between the first intermediate node 324 and the second intermediate node 326, in opposite directions. That is, the first intermediate node 324 electrically constitutes the same node as each of the input port of the seventh buffer 320 and the output port of the eighth buffer 322, and the second intermediate node 326 electrically constitutes the same node as each of the input port of the eighth buffer 322 and the output port of the seventh buffer 320. It should be appreciated that, in FIG. 3, extra buffers or inverters have been added to not change the polarity, but these could be left out (in which case the signals provided at the locations A, B, C, and D should be appropriately swapped).

Figure 4:
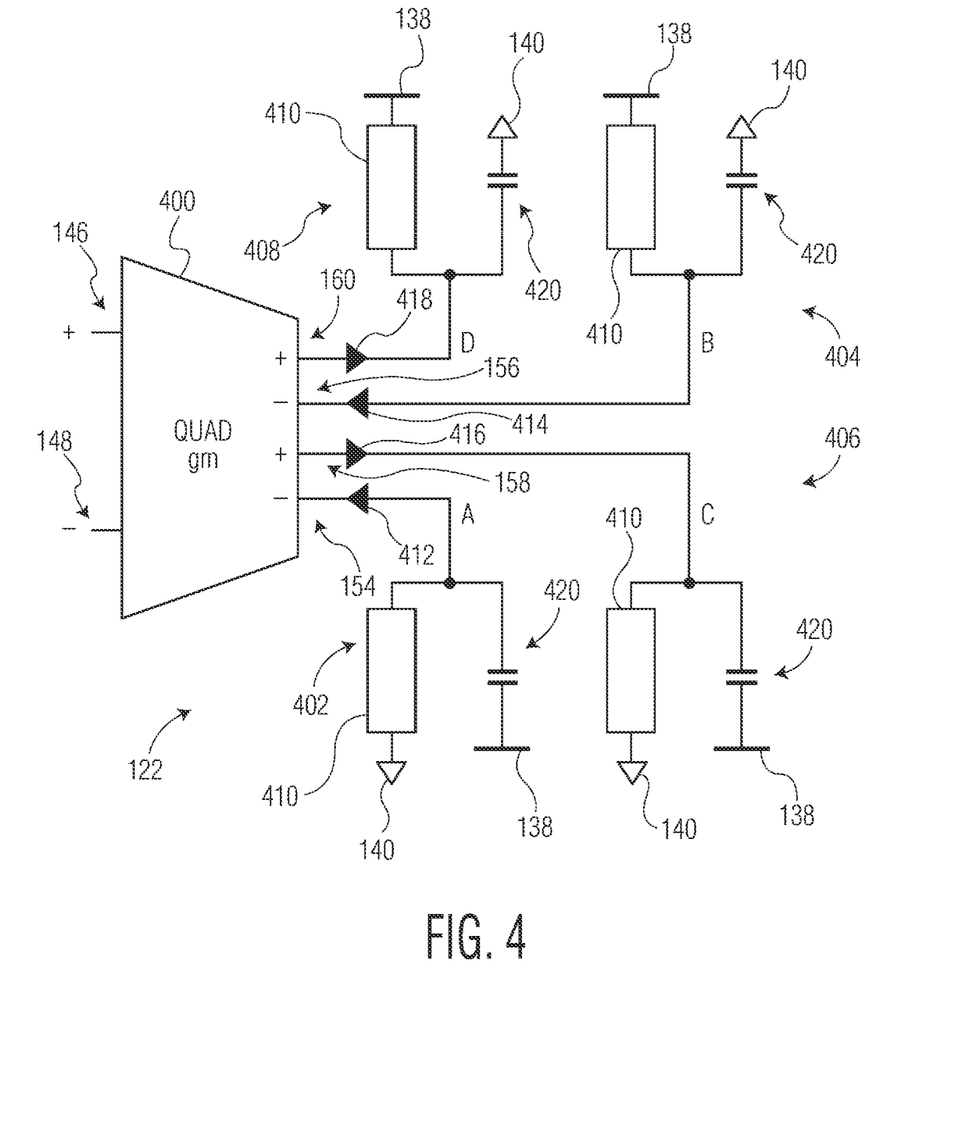
FIG. 4 is a schematic diagram showing an example operational amplifier arrangement that can be employed in either of the first and second DCC circuits of FIG. 1 and FIG. 3.

Turning to FIG. 4, a further schematic diagram shows the operational amplifier circuit 122 in further detail. As illustrated, the operational amplifier circuit 122 in the present embodiment includes a quad transconductance amplifier 400 and additionally includes each of first, second, third and fourth circuits 402, 404, 406, and 408, respectively. The quad transconductance amplifier 408 not only includes the first amplifier input port 146 and second amplifier input port 148 of the operational amplifier circuit 122, but also includes the first, second, third, and fourth output ports 154, 156, 158, and 160, which again are also labeled (as in FIG. 1) as A, B, C, and D, respectively. Each of the first, second, third, and fourth circuits 402, 404, 406, and 408 includes a respective resistor 410 and a respective capacitor 420 that are both respectively coupled to a respective one of the first, second, third, and fourth output ports 154, 156, 158, and 160. The quad transconductance amplifier 400 outputs, at the first, second, third, and fourth amplifier output ports 154, 156, 158, and 160, respective voltage signals represented by first, second, third, and fourth arrowheads 412, 414, 416, and 418, respectively.

The first, second, third, and fourth circuits 402, 404, 406, and 408 are particularly configured so that the respective voltage signals provided at the amplifier output ports 154, 156, 158, and 160 are appropriate to be provided as feedback signals to the different respective gates of the respective PMOS and NMOS transistors 134, 136 of the first and second inverter circuits 110, 112 as described in regard to FIG. 1 (also labeled as A, B, C, and D). In this regard, it is particularly desired that the respective voltage signals that are intended to be provided to the respective PMOS transistors 134 be inverted relative to the respective voltage signals that are intended to be provided to the respective NMOS transistors 136. To achieve this objective, as shown in FIG. 4, the respective resistors 410 of the first circuit 402 and third circuit 406 are respectively coupled between the ground voltage 140 and the first amplifier output port 154 and third amplifier output port 158, respectively, and the respective resistors 410 of the second circuit 404 and fourth circuit 408 are respectively coupled between the supply voltage 138 and the second amplifier output port 156 and fourth amplifier output port 160, respectively. Further, the respective capacitors 420 of the first circuit 402 and third circuit 406 are respectively coupled between the supply voltage 138 and the first amplifier output port 154 and third amplifier output port 158, respectively, and the respective capacitors 420 of the second circuit 404 and fourth circuit 408 are respectively coupled between the ground voltage 140 and the second amplifier output port 156 and fourth amplifier output port 160, respectively.

The respective gates of the respective PMOS transistors 134 (again, having labels A and C in FIG. 1) of the first and second inverter circuits 110 and 112 respectively are connected to the first output port 154 and the third output port 158 that are respectively coupled to the ground voltage 140 by way of the respective resistors 410 of the respective first circuit 402 and third circuit 406 (but respectively coupled to the supply voltage 138 by way of the respective capacitors 420 of those respective circuits). In contrast, the respective gates of the respective NMOS transistors 136 (again, having labels B and D in FIG. 1) of the first and second inverter circuits 110 and 112 respectively are connected to the second output port 156 and the fourth output port 160 that are respectively coupled to the supply voltage 138 by way of the respective resistors 410 of the respective second circuit 404 and fourth circuit 408 (but respectively coupled to the ground voltage 140 by way of the respective capacitors 420 of those respective circuits).

Given this arrangement, and particularly the arrangement of the resistors 410 relative to the supply voltage 138 and ground voltage 140, the current outputs out of, or into, the quad transconductance amplifier 400 via the first, second, third, and fourth output ports 154, 156, 158, and 160 occur in manners that result in desired voltage outputs suitable for controlling the PMOS and NMOS transistors 134, 136. As shown, each of the output ports 156 and 160 that is directly coupled to a respective gate of one of the NMOS transistors 136 is directly coupled to one of the resistors 410 that is connected to the supply voltage 138, and each of the output ports 154 and 158 that is directly coupled to a respective gate of one of the PMOS transistors 134 is directly coupled to one of the resistors 410 that is connected to the ground voltage 140. Consequently, if the inputs to the quad transconductance amplifier 400 (e.g., at the amplifier input ports 146 and 148) are equal, the output currents at the output ports 154, 156, 158, and 160 will be zero, and the resistors will pull the voltage at each of the respective output ports to one of the rails (either to the supply voltage 138 or to the ground voltage 140). However, if the inputs are unequal, certain one(s) of the voltage(s) at the output ports 154, 156, 158, and 160 will stay clipped to the supply voltage or ground voltage, while the other one(s) will have offset voltage(s) due to the current(s) through one or more of the resistors 410 (or, possibly, all of the voltage(s) at all of the output ports will have offsets).

The capacitors 420 particularly are added to each output (each of the output ports 154, 156, 158, and 160) for stability purposes. Although in the present embodiment, the respective capacitor 420 of each of the respective circuits 402, 404, 406, and 408 is coupled to the supply voltage 138 when the respective resistor 410 of the respective circuit is coupled to the ground voltage 140, and vice-versa, in other embodiments this need not be the case (e.g., the respective capacitor can be coupled to either the supply voltage or ground voltage in the same manner as is the case for the respective resistor of the respective circuit).

Figure 5:
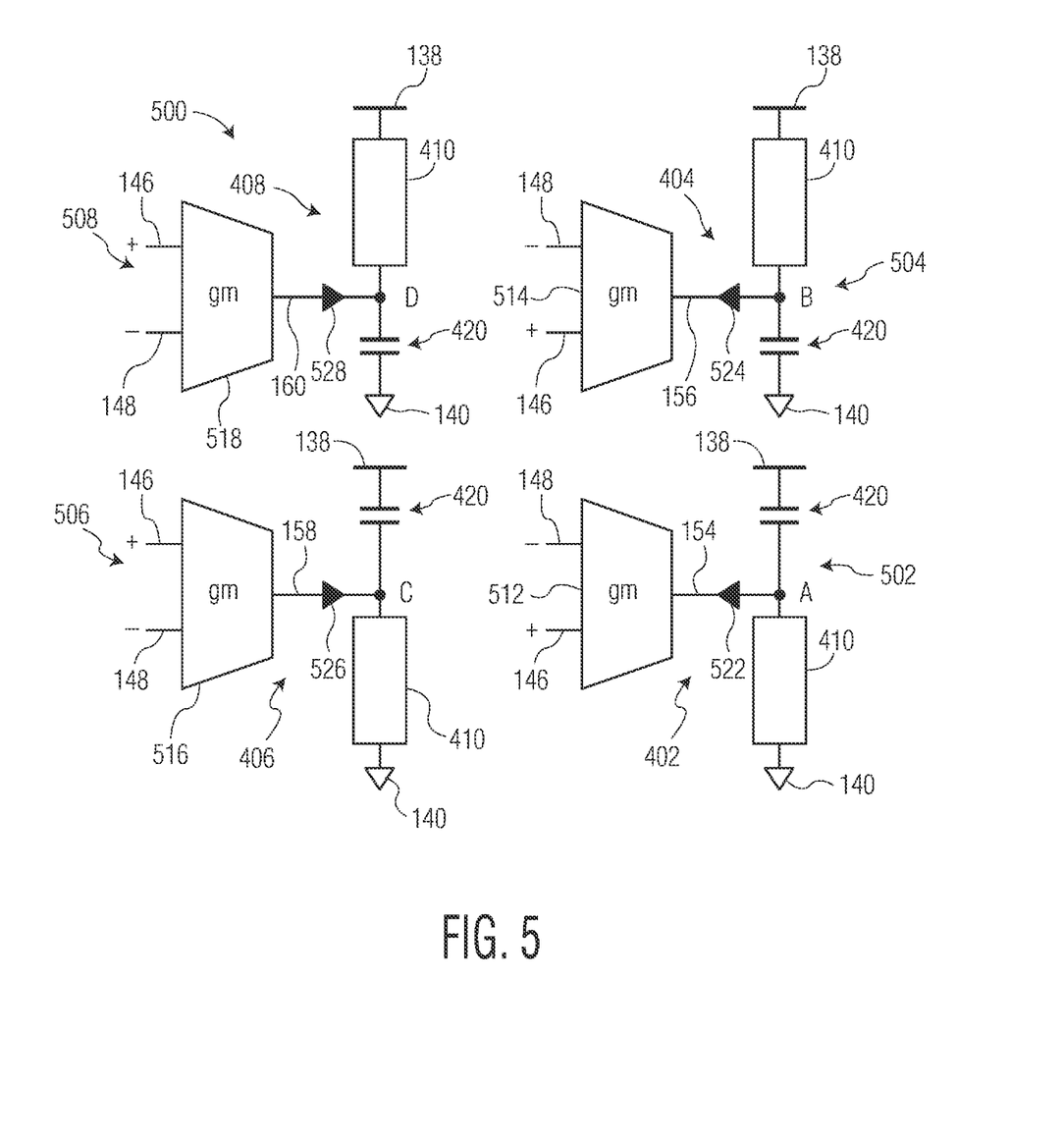
FIG. 5 is a schematic diagram showing another example operational amplifier arrangement that can be employed in either of the first and second DCC circuits of FIG. 1 and FIG. 3, in accordance with an alternate embodiment differing from that of FIG. 4.

Turning to FIG. 5, an additional schematic diagram shows an alternative embodiment of the operational amplifier circuit 122 in additional detail, as an operational amplifier circuit 500. In this alternate embodiment, the operational amplifier circuit 500 includes first, second, third, and fourth amplifier subcircuits 502, 504, 506, and 508. Instead of employing the quad transconductance amplifier 400, the first, second, third, and fourth subcircuits 502, 504, 506, and 508 respectively include first, second, third, and fourth transconductance amplifiers 512, 514, 516, and 518. Each of the first, second, third, and fourth transconductance amplifiers 512, 514, 516, and 518 includes the first amplifier input port 146 and the second amplifier input port 148. Although the first amplifier input ports 146 of the transconductance amplifiers 512, 514, 516, and 518 are not shown to be coupled to one another to form a single first amplifier input port, this is merely for simplicity of illustration and it should be recognized that all of the first amplifier input ports 146 shown in FIG. 5 are in fact coupled together to form a single node and a single first amplifier input port. Likewise, although the second amplifier input ports 148 of the transconductance amplifiers 512, 514, 516, and 518 are not shown to be coupled to one another to form a single second amplifier input port, this is merely for simplicity of illustration and it should be recognized that all of the second amplifier input ports 148 shown in FIG. 5 are in fact coupled together to form a single node and a single second amplifier input port.

The first, second, third, and fourth transconductance amplifiers 512, 514, 516, and 518 also respectively include the first, second, third, and fourth output ports 154, 156, 158, and 160, respectively, which again are also labeled (as in FIG. 1) as A, B, C, and D, respectively. Further, the operational amplifier 500 also includes the first, second, third, and fourth circuits 402, 404, 406, and 408. Again, each of the first, second, third, and fourth circuits 402, 404 406, and 408 includes the respective resistor 410 and the respective capacitor 420 that are both respectively coupled to the first, second, third, and fourth amplifier output ports 154, 156, 158, and 160, respectively. The respective transconductance amplifiers 512, 514, 516, and 518 output, at the first, second, third, and fourth amplifier output ports 154, 156, 158, and 160, respective voltage signals represented by first, second, third, and fourth arrowheads 522, 524, 526, and 528, respectively.

As with the operational amplifier 122 arrangement shown in FIG. 4, the first, second, third, and fourth circuits 402, 404, 406, and 408 are particularly configured so that the respective voltage signals provided at the amplifier output ports 154, 156, 158, and 160 are appropriate to be provided as feedback signals to the different respective gates of the respective PMOS and NMOS transistors 134, 136 of the first and second inverter circuits 110, 112 as described in regard to FIG. 1 (also labeled as A, B, C, and D). In this regard, it is particularly desired that the respective voltage signals that are intended to be provided to the respective PMOS transistors 134 be inverted relative to the respective voltage signals that are intended to be provided to the respective NMOS transistors 136. To achieve this objective, as shown in FIG. 5, the respective resistors 410 and capacitors 420 of the first, second, third, and fourth circuits 402, 404, 406, and 408 are coupled between either the supply voltage 138 or the ground voltage 140 and the amplifier output ports 154, 156, 158, and 160 in the same respective manners as described above in regard to FIG. 4.

Given this arrangement, the respective gates of the respective PMOS transistors 134 of the first and second inverter circuits 110 and 112, respectively (again, having labels A and C in FIG. 1), are connected respectively to the first output port 154 and the third output port 158, which are respectively coupled to the ground voltage 140 by way of the respective resistors 410 of the first circuit 402 and third circuit 406, respectively (but respectively coupled to the supply voltage 138 by way of the respective capacitors 420 of those respective circuits). In contrast, the respective gates of the respective NMOS transistors 136 of the first and second inverter circuits 110 and 112, respectively (again, having labels B and D in FIG. 1), are connected respectively to the second output port 156 and the fourth output port 160, which are respectively coupled to the supply voltage 138 by way of the respective resistors 410 of the second circuit 404 and fourth circuit 408, respectively (but respectively coupled to the ground voltage 140 by way of the respective capacitors 420 of those respective circuits). Although in the present embodiment of FIG. 5 the respective capacitor 420 of each of the respective circuits 402, 404, 406, and 408 is coupled to the supply voltage 138 when the respective resistor 410 of the respective circuit is coupled to the ground voltage 140, and vice-versa, in other embodiments this need not be the case (e.g., the respective capacitor can be coupled to either the supply voltage or ground voltage in the same manner as is the case for the respective resistor of the respective circuit).

Figure 6:
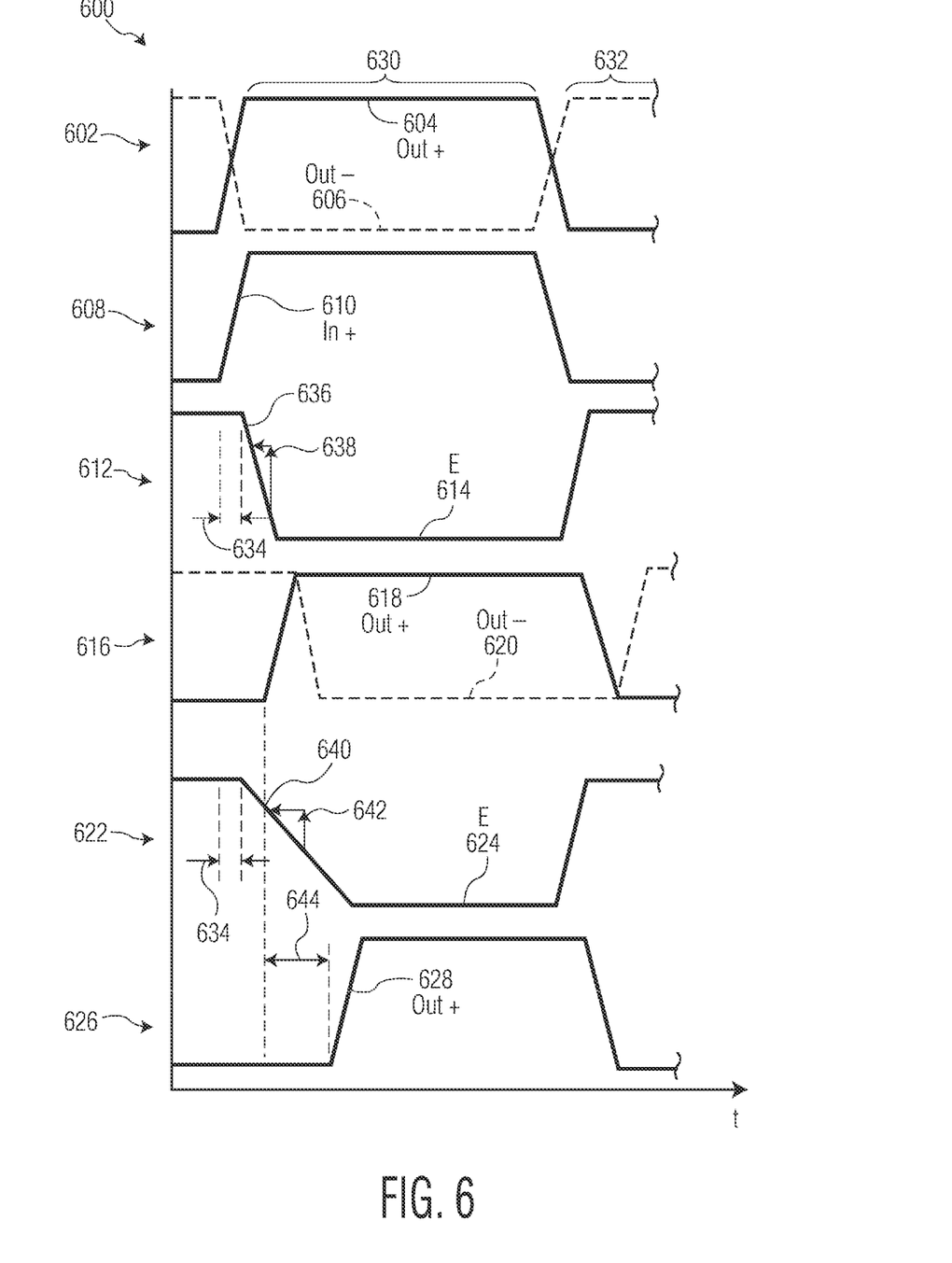
FIG. 6 is a timing diagram illustrating how the first and second DCC circuits of FIG. 1 and FIG. 3 can operate to perform duty cycle correction and/or achieve anti-phase operation.

Turning to FIG. 6, a timing diagram 600 is provided to illustrate example manners of operation of the first DCC circuit 100 and the third DCC circuit 300 in which those circuits operate to perform duty cycle correction and remove second order distortion (HD2). The timing diagram 600 particularly is intended to illustrate how each of the first DCC circuit 100 and the third DCC circuit 300 operate to provide feedback that causes (or tends to cause) both of the differential output signals (Out+ and Out−) output at the first output port 106 and the second output port 108 to have duty cycles that are equal (and, at least in some cases, exactly equal). The timing diagram 600 also is intended to illustrate that the third DCC circuit 300, due to operation of the cross-coupled inverter section 302, causes (or tends to cause) the output signals (Out+ and Out−) output respectively at the first output port 106 and the second output port 108 to be exactly or substantially in anti-phase (that is, 180 degrees out of phase with one another). In at least some embodiments, the first DCC circuit 100 and/or the third DCC circuit 300 (and/or other embodiments of DCC circuits or other circuits encompassed by the present disclosure) tend to cause both of the output signals (Out+ and Out−) output at the first output port 106 and the second output port 108 to each have 50% duty cycles. Nevertheless, achieving 50% duty cycles for these signals is not 100% essential for all embodiments encompassed herein.

More particularly, the timing diagram 600 of FIG. 6 shows each of a first graph 602, a second graph 608, a third graph 612, a fourth graph 616, a fifth graph 622, and a sixth graph 626. The first graph 602 graph illustrates portions of each of an example Out+ output signal 604 that can be output at the first output port 106 and an example Out− output signal 606 that can be output at the second output port 108, where the Out+ and Out− output signals are occurring concurrently over time. The second graph 608 additionally illustrates a portion of an example In+ input signal 610 that can be received at the first input port 102 of the first DCC 100 or second DCC 300, concurrently as the output signals 604, 606 are being generated.

It will be appreciated that each of the Out+ and Out− output signals 604, 606 are periodic signals (largely, but not exactly, square waves) with respective duty cycles. The respective duty cycle of each of the Out+ and Out− output signals 604, 606 is determined as the fraction of the time during each respective period of the respective signal during which the respective output signal has a high value (e.g., a value at the supply voltage 138 or closer to the supply voltage than to the ground voltage 140) rather than a low or lesser value, relative to the length of the respective period of the respective signal. Thus, in the example illustrated, the Out+ output signal 604 has a duty cycle equaling a time length 630 at which that signal has a high value, relative to the period of that signal (it being noted that FIG. 6 does not show the signal for a long enough time in order to show the signal over a complete period). Likewise, the Out− output signal 606 has a duty cycle equaling a time length 632 (shown only in part, in cutaway) at which that signal has a high value, relative to the period of that signal (again, FIG. 6 does not show the signal for a long enough time in order to show the signal over a complete period).

Embodiments of DCC circuits encompassed herein such as the first DCC circuit 100 and the second DCC circuit 200 among other things are intended to achieve operation in which the Out+ and Out− output signals (such as the output signals 604 and 606) respectively have duty cycles that are equal (preferably exactly equal). Although the first graph 602 shows portions of both the Out+ and Out− output signals 604 and 606, the first graph intentionally does not show complete periods of either of those signals. Consequently, the first graph 602 can be interpreted as showing either a circumstance in which the Out+ and Out− output signals 604, 606 have equal (or substantially equal) duty cycles or another circumstance in which those signals have duty cycles that are not equal (or substantially unequal). More particularly, assuming both of the output signals 604 and 606 have the same periodicity, the first graph 602 can be understood to illustrate a circumstance in which those signals have duty cycles that are equal if the time length 630 is understood to be equal to the time length 632, or alternatively can be understood to illustrate a circumstance in which those signals have duty cycles that are unequal if the time length of 630 is understood to be greater or lesser than the time length 632.

The third graph 612, fourth graph 616, fifth graph 622, and sixth graph 626 are particularly intended to illustrate how at least some embodiments of DCC circuits encompassed herein, such as the first DCC circuit 100 and second DCC circuit 300, operate to achieve desired operation in which the Out+ and Out− output signals (such as the output signals 604 and 606) respectively have duty cycles that are equal (preferably exactly equal). The third graph 612 and fourth graph 616 particularly illustrate example operation of the first DCC circuit 100 or the second DCC circuit 300 when the Out+ and Out− output signals 604, 606 already do have equal duty cycles (e.g., when the time length 630 equals the time length 632) and no correction or adjustment is needed. By contrast, the fifth graph 622 and sixth graph 626 particularly illustrate example operation of the first DCC circuit 100 or the second DCC circuit 300 when the Out+ and Out− output signals 604, 606 have unequal (or substantially unequal) duty cycles (e.g., when the time length 630 does not equal the time length 632), such that correction or adjustment is appropriate.

In the first circumstance when the Out+ and Out– output signals (e.g., the output signals 604 and 606) have duty cycles that are equal, the first and third output signals generated by the operational amplifier circuit 122 at the first and third output ports 154 and 158 (e.g., as labeled by A and C) take on the ground voltage 140. Further, the second and fourth output signals generated by the operational amplifier circuit 122 at the second and fourth output ports 156 and 160 (e.g., as labeled by B and D) take on the supply voltage 138. Correspondingly, the respective gates of the respective PMOS transistors 134 of the first and second inverter circuits 110 and 112 also are pulled to ground, and the respective gates of the respective NMOS transistors 136 of the first and second inverter circuits 110 and 112 also are pulled to supply. With such settings of the respective gates of the respective PMOS and NMOS transistors 134, 136, those transistors do not serve to provide any (or any significant) current limiting role in terms of the currents that flow into and out of the respective buffers 132 of the first and second inverter circuits 110 and 112.

Given such operation by the operational amplifier circuit 122, intermediate output signals output from the first inverter output port 124 of the first inverter circuit 110 and from the second inverter output port 128 of the second inverter circuit 112 (respectively labeled E and F in FIG. 1) are unaffected or substantially unaffected by the operation of the operational amplifier circuit. In particular, as little delay as possible is added, and phase noise is minimized. The third graph 612 of FIG. 6 particularly shows in this regard that, aside from a slight delay 634 caused by operation of the first inverter circuit 110, a first intermediate output signal 614 of the first inverter circuit 112 (again, labeled E in FIG. 1) is essentially identical to the In+ input signal 610 of the second graph 608, aside from being inverted. Correspondingly, the Out+ and Out– output signals that are respectively output at the first and second output ports 106 and 108 also are unaffected or substantially unfaced by the operation of the operational amplifier circuit 122. The fourth graph 616 of FIG. 6 particularly shows in this regard that, aside from a slight further delay caused by operation of the first buffer 114, an example Out+ output signal 618 that would be output by the first buffer in response to the first intermediate output signal 614 is essentially identical to the first intermediate output signal, aside from being inverted. Thus, the Out+ output signal 618 is essentially identical to the example In+ input signal 610 except for being delayed.

In contrast, in the second circumstance when the Out+ and Out– output signals (e.g., the output signals 604 and 606) have duty cycles that are unequal (or substantially unequal), the output signals generated by the operational amplifier circuit 122 at the first, second, third, and fourth output signals 154, 156, 158, and 160 can take on different values depending upon the particular differences between the Out+ and Out– output signals and the duty cycles thereof. For example, if the Out+ output signal 604 has a larger duty cycle than the Out– output signal 606 (e.g., the time length 630 exceeds the time length 632), then the operational amplifier circuit 122 particularly will cause the output voltage at the second output port 156 (e.g., labeled B) to be lowered to a level below the supply voltage 138, and will cause the output voltage at the third output port 158 (e.g., label C) to be elevated to a level above the ground voltage 140.

More particularly in this scenario, supposing that the operational amplifier circuit 122 takes the form shown in FIG. 4, current will flow into the quad transconductance amplifier 400 via the resistor 410 coupled to the second output port 156 so as to reduce the voltage at the second output port below the supply voltage 138, and current will flow out of the quad transconductance amplifier via the resistor 410 coupled to the third output 158 so as to increase the voltage at the third output port above the ground voltage 140. Correspondingly, the gate of the NMOS transistor 136 of the first inverter circuit 110 will be lowered below the supply voltage 138 and cause that NMOS transistor to perform current limiting, and the gate of the PMOS transistor 134 of the second inverter circuit 112 will be raised above the ground voltage 140 and cause that PMOS transistor to also perform current limiting.

Given such operation by the operational amplifier circuit 122, intermediate output signals output from the first inverter output port 124 of the first inverter circuit 110 and from the second inverter output port 128 of the second inverter circuit 112 (respectively labeled E and F in FIG. 1) will be adjusted from what would happen if the Out+ and Out– output signals had equal duty cycles (e.g., as illustrated by the third and fourth graphs 612 and 616). In this regard, the fifth graph 622 shows that a first intermediate output signal 624 output by the first inverter output port 124 of the first inverter circuit 110 (again, labeled E in FIG. 1) in this circumstance not only experiences the slight delay 634 caused by operation of the first inverter circuit 110, but also exhibits a slower falling edge (or multiple slower falling edges over multiple periods) due to the reduction in the voltage applied at the gate of the NMOS transistor 136 of the first inverter circuit 110 (at the location labeled as B in FIG. 1). That is, by comparison with a falling edge 636 of the first intermediate output signal 614 discussed above, which has a slope 638, a falling edge 640 of the first intermediate output signal 624 exhibits a slope 642 with a smaller magnitude (or a more gradual downward sloping). Additionally, although not shown in FIG. 6, it should be appreciated that a second intermediate output signal output by the second inverter output port 128 of the second inverter circuit 112 would have a slower rising edge (or multiple slower rising edges over multiple periods) due to the increase of the voltage at the gate of the PMOS transistor 134 of the second inverter circuit 112 (at the location labeled as C in FIG. 1).

In view of the changes to the intermediate output signals output at the first and second inverter output ports 124 and 128, the Out+ and Out– output signals provided at the first and second output ports 106 and 108 experience duty cycle correction. The sixth graph 626 of FIG. 6 particularly shows in this regard that, due to the modification to the first intermediate output signal 624 with the slower falling edge, an Out+ output signal 628 provided at the first output port 106 has a delayed rising edge (or multiple delayed rising edges over multiple periods) by comparison with the Out+ output signal 618 provided in the equal duty cycle circumstance discussed above. In this example, the Out+ output signal 628 has a rising edge that is delayed, relative to the counterpart rising edge of the Out+ output signal 618, by a time delay 644. Additionally, although not shown in FIG. 6, it should be appreciated that an Out– output signal provided at the second output port 108 would, in response to a slower rising edge of the second intermediate output signal provided by the second inverter output port 128, experience a delayed falling edge by comparison with the Out– output signal that would have been generated in the equal duty cycle circumstance. By virtue of both of these adjustments, the respective duty cycles of both the Out+ and Out– output signals are adjusted and corrected to become (or are directed toward becoming) equal to one another.

In view of the above discussion, it should be appreciated that the timing diagram of FIG. 6 among other things can be understood to illustrate example changes over time of the differential output signals provided at the first and second output ports 106 and 108 of the first DCC circuit 100 during which duty cycle errors (differences in the duty cycles of the two different differential output signals) are corrected. For example, assuming that the first timing graph 602 shows a circumstance in which the differential output signals (Out+ and Out− output signals) have duty cycles that are unequal, then the first timing graph 602 can be understood to show those differential output signals at or during a first time (or time period), and the sixth timing graph 626 can be understood as showing those same differential output signals at or during a second time (or time period) that is later than the first time (or time period).

The manners of operation described above in relation to FIG. 6 can be achieved by a variety of embodiments of DCC circuits as encompassed herein, including both the first DCC circuit 100 and the second DCC circuit 300. Although duty cycle correction operation causing the Out+ and Out− output signals to have equal duty cycles is one objective of at least some embodiments encompassed herein, at least some of those embodiments or other embodiments can also achieve an additional objective of causing the Out+ and Out− output signals to be in exact (or substantially exact) anti-phase. Embodiments such as the second DCC circuit 300 that have a cross-coupled inverter section can achieve this further objective of attaining anti-phase.

FIG. 6 figuratively illustrates such operation if one compares the fourth graph 616 with the first graph 602. Although not mentioned above, FIG. 6 not only shows an example portion of the Out+ output signal 618 but also shows an example portion of an Out− output signal 620. Further, it can be seen that the Out− output signal 620 is not exactly in anti-phase relative to the Out+ output signal 618 insofar as the falling edge of the Out− signal 620 only begins when the closest nearby rising edge of the Out+ output signal 618 is complete, and further insofar as the rising edge of the Out− signal 620 only begins when the closest nearby falling edge of the Out+ output signal 618 is complete. This is in contrast to the arrangement shown in the first graph 602, in which the Out+ output signal 604 and Out− output signal 606 are exactly in anti-phase such that the rising edge of the Out+ output signal 604 crosses the falling edge of the Out− output signal 606 exactly at the midpoints of those edges, and vice-versa.

Inclusion of a cross-coupled inverter section such as the cross-coupled inverter section 302 in the second DCC circuit 300 of FIG. 3 particularly has the effect of eliminating phase discrepancies between the Out+ and Out− output signals provided from the first and second output ports 106 and 108 of the DCC circuit. That is, even if a DCC circuit lacking a cross-coupled inverter section such as the first DCC circuit 100 can produce Out+ and Out− output signals that are not in anti-phase, such as the signals 618 and 620 of the third graph 616, a DCC circuit having a cross-coupled inverter section such as the second DCC circuit 300 will produce Out+ and Out− output signals that are in anti-phase, such as the signals 604 and 606 of the first graph 602 of FIG. 1.

In view of FIGS. 1 through 6, it should be recognized that various embodiments encompassed herein can have one or more features and perform one or more types of duty cycle correction or adjustments with respect to differential output signals. For example, in a first step and as discussed in regard to FIG. 1, at least some embodiments encompassed herein envision an inverter circuit in combination with a feedback circuit that operates to equalize the duty cycles of differential outputs. In some such embodiments, the inverter circuit not only includes inverters by which the inverter circuit receives both inputs of a differential signal, but also includes current limiting transistors positioned both at the supply and ground sides of each inverter. The outputs of each of the inverters are buffered again by way of buffers (which can be, but need not be, considered to form part of the overall inverter circuit), and the differential output signals from the buffers constitute the overall differential output of the circuit. Also, the differential outputs from the buffers are provided to the feedback circuit, which in turn provides signals to govern or influence operations of the different current limiting transistors. The feedback circuit can be an analog control circuit, and can take any of variety of forms depending upon the embodiment.

In at least some embodiments encompassed herein, the differential outputs from the buffers are provided to low pass filter(s) that in turn are coupled to an operational amplifier circuit, where the operational amplifier circuit together with the low pass filter(s) can be considered the feedback circuit. The low pass filter(s) operate as duty-cycle to DC converter(s) (for example, assuming a supply voltage of Vdd, an output having a voltage value of Vdd/2 would correspond to a 50% duty cycle). The operational amplifier circuit can have four amplifier outputs, namely, one for each of the four current limiting transistors that are coupled to the inverters. Further, the operational amplifier circuit operates so that, if there is no duty cycle error (e.g., when there is no difference between the duty cycles of the differential outputs), then the operational amplifier circuit provides amplifier outputs to the current limiting transistors that tend to cause the transistors to not limit current. Additionally, the operational amplifier circuit operates so that, if (alternatively) there is duty cycle error (e.g., when there is a difference, or significant difference, between the duty cycles of the differential outputs), then the operational amplifier circuit provides amplifier outputs to the current limiting transistors that tend to cause one or more of the transistors to limit current into or out of one or both of the inverters. Such current limiting operation can tend to delay the input signal when there is a duty cycle error. Preferably, the operational amplifier circuit starts delaying the input signal when there is actually a duty cycle error and, when there is an error, the operational amplifier circuit delays what is needed to fix the error (and not more).

For example, if the current limiting transistors include both NMOS transistors coupled between the inverters and ground and also PMOS transistors coupled between the inverters and supply, the amplifier outputs of the operational amplifier circuit can be configured to cause the gates of the NMOS current limiters to be pulled to supply, and to cause the gates of the PMOS current limiters to be pulled to ground when the duty cycles of the differential outputs are equal. At this point, there is as little delay added as possible, and phase noise is minimized. Alternatively for example, if the positive differential output has larger duty cycle than the negative differential output (or vice-versa), then the operational amplifier circuit will generate amplifier outputs so that, on one side (in relation to one of the inverters) the NMOS current limiter will be somewhat current limited, and at the other side the PMOS current limiter will be somewhat current limited. Thus, when configured in this manner, the operational amplifier circuit operates to provide two outputs high (for the NMOS) and two low (for the PMOS) when there are equal inputs but, when an error is introduced, one high output moves down, and one low output moves up. Such control over the operation of the current limiting transistors will cause the duty cycles of the differential outputs to become balanced again, with the result particularly being that both halves (differential outputs) will have an equal duty cycle, with as little delay as possible (as any delay that is added can result in phase noise being added, which typically is not desirable).

Additionally for example, in a second step and as discussed in regard to FIG. 3, at least some further embodiments encompassed herein envision that cross coupled inverters are added, so as to cause (force) the crossing point of a differential signal to be at the midpoint between the high and low levels of the signal (e.g., if the differential outputs' high level is a supply voltage of Vdd, then the crossing point would be at a voltage level of Vdd/2). Such cross-coupled inverters can be positioned in between the inverters and the buffers of an inverter circuit such as described above. In embodiments in which both a cross-coupled inverter circuit is implemented such that the differential output crossing point is forced to be at a midpoint (e.g., at Vdd/2), and a feedback circuit (e.g., operational amplifier circuit) also is implemented so that the duty cycle of the two differential outputs is forced to be equal, there is only a single differential output signal configuration that fits both of these conditions—namely, a configuration in which both of the differential outputs have a 50% duty cycle (exactly, or substantially) and are 180 degrees out of phase (exactly, or substantially). Of course, in practice, mismatch and other non-ideal effects can limit the extent to which the differential output signals take on these characteristics. However, any mismatch in the operational amplifier circuit is (largely) a matter of scaling, and if the cross coupled inverters are not sufficient, a second stage can be added.

Notwithstanding the above description, the present disclosure is intended to encompass numerous embodiments including those disclosed herein and a variety of alternate embodiments. For example, although the above description envisions the use of a single stage operational amplifier circuit having four transconductance amplifier stages (one for each output), in other embodiments, a multi-stage operational amplifier circuit arrangement can be employed (albeit such an arrangement would increase complexity). Further, the present disclosure is intended to encompass embodiments employing other types of amplifiers, gain amplifiers, operational amplifiers, or other amplification circuits. Also, although the above description envisions the use of NMOS and PMOS devices, any of a variety of other types of transistor devices can be utilized depending upon the embodiment including, for example, bipolar junction transistors (BJTs). Also, although some connections herein are described as being direct, such that two terminals or ports constitute the same electrical node, the present disclosure is also intended to encompass other embodiments in which such terminals are coupled but not necessarily coupled directly. Further, the present disclosure is intended to encompass embodiments that lack one or more components described herein such as, for example, the buffers 114 and 116 of FIGS. 1 and 3.

Further, in at least one example embodiment, the present disclosure relates to a duty cycle correction (DCC) circuit for use in relation to differential signal communications. The circuit includes a differential signal inverter circuit and a feedback circuit. The differential signal inverter circuit includes a first inverter circuit and a second inverter circuit, where the first inverter circuit includes a first differential signal input port and includes or is coupled at least indirectly to a first differential signal output port, and where the second inverter circuit includes a second differential signal input port and includes or is coupled at least indirectly to a second differential signal output port. Each of the first inverter circuit and the second inverter circuit includes a respective inverter, a respective first transistor device coupled between the respective inverter and a first voltage, and a respective second transistor device coupled between the respective inverter and a second voltage, and each of the first and second transistor devices includes a respective feedback input port. The feedback circuit is coupled to the first and second differential signal output ports and also to the feedback input ports of the first and second transistor devices. Additionally, the feedback circuit includes an operational amplifier circuit including first and second amplifier input ports, a plurality of feedback output ports coupled at least indirectly with the respective feedback input ports, and at least one transconductance amplifier coupled between the amplifier input ports and the feedback output ports. The feedback circuit also includes first and second low pass filters respectively coupling the first and second differential signal output ports, respectively, with the first and second amplifier input ports, respectively. Further, the feedback circuit operates to provide one or more feedback signals from one or more of the feedback output ports to one or more of the feedback input ports based upon respective duty cycles exhibited by first and second output signals respectively provided at the first and second differential signal output ports, respectively, the one or more feedback signals causing one or more of the first and second transistor devices to perform current limiting depending upon a first difference between the respective duty cycles at a first time. Respective duty cycles of additional first and second output signals respectively provided at the first and second differential signal output ports at a second time subsequent to the first time are equal or substantially equal based on the current limiting.

Additionally, in at least one example embodiment, the present disclosure relates to a method of providing duty cycle correction in relation to differential signal communications. The method includes providing first and second differential output signals respectively at first and second differential signal output ports of a differential signal inverter circuit, at a first time. The differential signal inverter circuit includes a first inverter circuit and a second inverter circuit, where the first inverter circuit includes a first differential signal input port and includes or is coupled at least indirectly to the first differential signal output port, and where the second inverter circuit includes a second differential signal input port and includes or is coupled at least indirectly to the second differential signal output port. Also, each of the first inverter circuit and the second inverter circuit includes a respective inverter, a respective first transistor device coupled between the respective inverter and a first voltage, and a respective second transistor device coupled between the respective inverter and a second voltage, and each of the first and second transistor devices includes a respective feedback input port. The method further includes generating first, second, third, and fourth feedback output signals based upon the first and second amplifier input signals by way of a feedback circuit, where one or more of the first, second, third, and fourth feedback output signals is generated at least partly in response to a first difference between a respective duty cycle of the first differential output signal at the first time and a respective duty cycle of the second differential output signal at the first time. Additionally, the method includes applying the first, second, third, and fourth feedback output signals to the respective feedback input ports of the respective first and second transistor devices so that one or more of the first and second transistor devices performs current limiting with respect to one or more currents flowing into or out of one or more of the respective inverters of the first and second inverter circuits. Further, the method includes operating the differential signal inverter circuit in a manner influenced by the current limiting so as to provide additional first and second differential output signals respectively at the first and second differential signal output ports of the differential signal inverter circuit, at a second time. A second difference between respective duty cycles of the additional first and second differential output signals at the second time is either zero or less than the first difference.

Further, in at least one additional example embodiment, the present disclosure relates to a radio frequency (RF) differential signal communication system configured to provide duty cycle correction. The system includes a differential signal inverter circuit including first and second inverters respectively having first and second differential signal input ports, first and second PMOS transistor devices, first and second NMOS transistor devices, and first and second buffers coupled respectively to the first and second inverters and respectively having first and second differential signal output ports, where the respective PMOS transistor devices are respectively coupled between a supply voltage and the respective inverters, and where the respective NMOS transistor devices are respectively coupled between a ground voltage and the respective inverters. The system also includes a feedback circuit coupled between the first and second differential signal output ports and respective feedback input ports of each of the first and second PMOS transistor devices and the first and second NMOS transistor devices. The feedback circuit is configured to generate one or more feedback signals for application at one or more of the feedback input ports, the one or more feedback signals being based at least indirectly in response to a first difference at a first time between a first duty cycle of a first differential output signal provided at the first differential signal output port and a second duty cycle of a second differential output signal provided at the second differential signal output port. One or more of the transistor devices performs current limiting in response to the one or more feedback signals being applied at the one or more of the feedback input ports. Respective duty cycles of additional first and second output signals respectively provided at the first and second differential signal output ports at a second time subsequent to the first time are equal or substantially equal based at least in part on the current limiting.

One or more of the embodiments encompassed herein can be advantageous in any of a variety of respects. Among other things, one or more of the embodiments encompassed herein can address one or more of the concerns mentioned above relating to conventional systems. Indeed, as already mentioned, in the context of RF communications involving RF circuits, it is often necessary to communicate differential signals such as a local oscillator (LO) signal over large distances. To achieve the delivery of such differential signals over large distances typically require buffers. However, the use of buffers in conventional systems often can diminish performance and signal quality in various manners. More particularly, the use of buffers in conventional systems can degrade performance in terms of duty cycle and/or in terms of the balance of any differential signal being communicated. Both in receivers and transmitters, this can diminish second order distortion (HD2) performance, which can be particularly problematic. Additionally, conventional efforts to address such concerns can create other problems. For example, avoiding excessive noise in RF signals can be of importance in achieving desired signal communications, yet conventional efforts to address one or more of the concerns mentioned above can involve adding noise to the signals being communicated.

In contrast to such conventional systems, as already described above, at least some embodiments encompassed herein particularly can achieve operation in which output differential signals attain equal (exactly, or substantially) duty cycles. Additionally, at least some embodiments encompassed herein can achieve output differential signals that are in anti-phase (exactly, or substantially). Further, at least some embodiments encompassed herein can achieve output differential signals that each have 50% (or approximately 50%) duty cycles. To achieve such advantageous operations, at least some such embodiments employ an analog control loop which only adds the bare minimum delay needed to fix duty cycle errors by current starving either the positive or the negative half of an inverter. Together with cross coupled inverters this suppresses any form of HD2 in a differential (e.g., LO) signal for the least added phase noise.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A duty cycle correction (DCC) circuit for use in relation to differential signal communications, the circuit comprising:

a differential signal inverter circuit including a first inverter circuit and a second inverter circuit, wherein the first inverter circuit includes a first differential signal input port and includes or is coupled at least indirectly to a first differential signal output port, and wherein the second inverter circuit includes a second differential signal input port and includes or is coupled at least indirectly to a second differential signal output port, wherein each of the first inverter circuit and the second inverter circuit includes a respective inverter, a respective first transistor device coupled between the respective inverter and a first voltage, and a respective second transistor device coupled between the respective inverter and a second voltage, and wherein each of the first and second transistor devices includes a respective feedback input port; and a feedback circuit coupled to the first and second differential signal output ports and also to the feedback input ports of the first and second transistor devices, wherein the feedback circuit includes an operational amplifier circuit including first and second amplifier input ports, a plurality of feedback output ports coupled at least indirectly with the respective feedback input ports, and at least one transconductance amplifier coupled between the amplifier input ports and the feedback output ports, and wherein the feedback circuit also includes first and second low pass filters respectively coupling the first and second differential signal output ports, respectively, with the first and second amplifier input ports, respectively, and wherein the feedback circuit operates to provide one or more feedback signals from one or more of the feedback output ports to one or more of the feedback input ports based upon respective duty cycles exhibited by first and second output signals respectively provided at the first and second differential signal output ports, respectively, the one or more feedback signals causing one or more of the first and second transistor devices to perform current limiting depending upon a first difference between the respective duty cycles at a first time, wherein respective duty cycles of additional first and second output signals respectively provided at the first and second differential signal output ports at a second time subsequent to the first time are equal or substantially equal based on the current limiting, wherein the operational amplifier circuit additionally includes a plurality of additional circuit components that respectively couple the respective feedback output ports with one or both of the first and second voltages.

2. The DCC circuit of claim 1, wherein the first voltage is a supply voltage and the second voltage is a ground voltage.

3. The DCC circuit of claim 2, each of the first transistor devices is a respective P-type metal-oxide-semiconductor (PMOS) transistor device and each of the second transistor devices is a respective N-type metal-oxide-semiconductor (NMOS) transistor device, and wherein each of the feedback input ports is a respective gate terminal of a respective one of the PMOS and NMOS transistor devices.

4. The DCC circuit of claim 3, wherein the feedback output ports respectively are coupled directly with the respective feedback input ports, respectively.

5. The DCC circuit of claim 3, wherein each of the respective PMOS transistor devices of the first and second inverter circuits includes a respective source terminal that is coupled to the supply voltage and a respective drain terminal that is coupled to the respective inverter, and wherein the each of the respective NMOS transistor devices of each of the first and second inverter circuits includes a respective drain terminal that is coupled to the respective inverter and a respective source terminal that is coupled to the ground voltage.

6. The DCC circuit of claim 1, further comprising first and second buffers, wherein the first buffer includes a first buffer input port that is coupled at least indirectly to a first inverter output port of the respective inverter of the first inverter circuit, wherein the second buffer includes a second buffer input port that is coupled at least indirectly to a second inverter output port of the respective inverter of the second inverter circuit, wherein the first buffer additionally includes a first buffer output port that is at least indirectly coupled to, or constitutes, the first differential signal output port, and wherein the second buffer additionally includes a second buffer output port that is at least indirectly coupled to, or constitutes, the second differential signal output port.

7. The DCC circuit of claim 6, wherein the first buffer input port is coupled directly to the first inverter output port, and wherein the second buffer input port is coupled directly to the second inverter output port.

8. The DCC circuit of claim 6, further comprising a cross-coupled inverter circuit coupled to each of the first inverter output port, the first buffer input port, the second inverter output port, and the second buffer input port, wherein the additional first and second output signals respectively provided at the first and second differential signal output ports at the second time are in, or substantially in, anti-phase.

9. The DCC circuit of claim 8, wherein the cross-coupled inverter circuit includes third, fourth, fifth, sixth, seventh, and eighth buffers, wherein the third buffer is coupled between the first inverter output port and a first intermediate node, the fourth buffer is coupled between the second inverter output port and a second intermediate node, the fifth buffer is coupled between the first intermediate node and the first buffer input port, and the sixth buffer is coupled between the second intermediate node and the second buffer input port, and wherein each of the seventh and eight buffers is respectively coupled between the first and second intermediate nodes in opposite directions, respectively, wherein the respective duty cycles of each of the additional first and second output signals respectively provided at the first and second differential signal output ports at the second time is 50% or substantially 50%.

10. The DCC circuit of claim 1, wherein the plurality of feedback output ports includes first, second, third, and fourth feedback output ports, and wherein the one or more feedback signals are voltage signals.

11. The DCC circuit of claim 10, wherein the at least one transconductance amplifier includes is a quad transconductance amplifier or includes first, second, third, and fourth transconductance amplifiers, and wherein the at least one transconductance amplifier is coupled between the amplifier input ports and the feedback output ports.

12. The DCC circuit of claim 1, wherein the plurality of additional circuit components include a plurality of resistors.

13. The DCC circuit of claim 12, wherein the first voltage is a supply voltage and the second voltage is a ground voltage, wherein each of the first transistor devices is a respective PMOS transistor device and each of the second transistor device is a respective NMOS transistor device, wherein the respective feedback input port of each of the respective PMOS transistor devices is coupled to a respective one of the feedback output ports that is respectively coupled to the ground voltage by a respective of the resistors, and wherein the respective feedback input port of each of the respective NMOS transistor devices is coupled to a respective one of the feedback output ports that is respectively coupled to the supply voltage by a respective one of the resistors.

14. A method of providing duty cycle correction in relation to differential signal communications, the method comprising:

providing first and second differential output signals respectively at first and second differential signal output ports of a differential signal inverter circuit, at a first time, wherein the differential signal inverter circuit includes a first inverter circuit and a second inverter circuit, wherein the first inverter circuit includes a first differential signal input port and includes or is coupled at least indirectly to the first differential signal output port, wherein the second inverter circuit includes a second differential signal input port and includes or is coupled at least indirectly to the second differential signal output port, wherein each of the first inverter circuit and the second inverter circuit includes a respective inverter, a respective first transistor device coupled between the respective inverter and a first voltage, and a respective second transistor device coupled between the respective inverter and a second voltage, and wherein each of the first and second transistor devices includes a respective feedback input port;

generating first, second, third, and fourth feedback output signals based upon the first and second amplifier input signals by way of a feedback circuit, wherein one or more of the first, second, third, and fourth feedback output signals is generated at least partly in response to a first difference between a respective duty cycle of the first differential output signal at the first time and a respective duty cycle of the second differential output signal at the first time;

applying the first, second, third, and fourth feedback output signals to the respective feedback input ports of the respective first and second transistor devices so that one or more of the first and second transistor devices performs current limiting with respect to one or more currents flowing into or out of one or more of the respective inverters of the first and second inverter circuits; and operating the differential signal inverter circuit in a manner influenced by the current limiting so as to provide additional first and second differential output signals respectively at the first and second differential signal output ports of the differential signal inverter circuit, at a second time, wherein a second difference between respective duty cycles of the additional first and second differential output signals at the second time is either zero or less than the first difference; and wherein the generating of the first, second, third, and fourth feedback output signals additionally includes conducting one or more currents to or from one or more of first, second, third, and fourth amplifier output ports of at least one transconductance amplifier, by way of a plurality of additional circuit components that respectively couple respective amplifier output ports of the at least one transconductance amplifier with one or both of the first and second voltages.

15. The method of claim 14, wherein the generating of the first, second, third, and fourth feedback output signals includes filtering the first and second differential output signals by way of low pass filters so as to generate first and second amplifier input signals that are indicative of the first difference, and, wherein the generating of the first, second, third, and fourth feedback output signals also includes performing an amplification by way of the at least one transconductance amplifier based upon the first and second amplifier input signals.

16. The method of claim 15, wherein the generating of the first, second, third, and fourth feedback output signals additionally includes conducting the one or more currents to or from the one or more of first, second, third, and fourth amplifier output ports of the at least one transconductance amplifier, by way respective resistors coupling the respective amplifier output ports with either a supply voltage or a ground voltage, wherein the first, second, third, and fourth feedback output signals respectively concerning respective voltages at the respective amplifier output ports.

17. The method of claim 16, wherein the differential signal inverter circuit additionally includes first and second buffers and a cross-coupled inverter circuit, and wherein due to the cross-coupled inverter circuit the additionally first and second output signals are substantially or exactly in anti-phase.

18. A radio frequency (RF) differential signal communication system configured to provide duty cycle correction, the system comprising:

a differential signal inverter circuit including first and second inverters respectively having first and second differential signal input ports, first and second PMOS transistor devices, first and second NMOS transistor devices, and first and second buffers coupled respectively to the first and second inverters and respectively having first and second differential signal output ports, wherein the respective PMOS transistor devices are respectively coupled between a supply voltage and the respective inverters, and wherein the respective NMOS transistor devices are respectively coupled between a ground voltage and the respective inverters; and a feedback circuit coupled between the first and second differential signal output ports and respective feedback input ports of each of the first and second PMOS transistor devices and the first and second NMOS transistor devices, wherein the feedback circuit is configured to generate one or more feedback signals for application at one or more of the feedback input ports, the one or more feedback signals being based at least indirectly in response to a first difference at a first time between a first duty cycle of a first differential output signal provided at the first differential signal output port and a second duty cycle of a second differential output signal provided at the second differential signal output port, and wherein one or more of the transistor devices performs current limiting in response to the one or more feedback signals being applied at the one or more of the feedback input ports, wherein respective duty cycles of additional first and second output signals respectively provided at the first and second differential signal output ports at a second time subsequent to the first time are equal or substantially equal based at least in part on the current limiting.

19. The RF communications system of claim 18, wherein the system is one of a RF transmitter, a RF receiver, or a RF transceiver, and wherein system additionally includes a cross-coupled inverter circuit coupled between the first and second inverters and the first and second buffers, wherein the additional first and second output signals respectively provided at the first and second differential signal output ports at the second time are in, or substantially in, anti-phase.

* * * * *